(12) United States Patent
Zhang et al.

(10) Patent No.: US 11,384,989 B2
(45) Date of Patent: Jul. 12, 2022

(54) COOLING SYSTEMS AND METHODS USING SINGLE-PHASE FLUID

(71) Applicant: Inertech IP LLC, Danbury, CT (US)

(72) Inventors: Ming Zhang, Weston, CT (US); Ken Nguyen, Danbury, CT (US); Doron Shapiro, St. Louis, MO (US); John Costakis, Glasco, NY (US)

(73) Assignee: INERTECH IP LLC, Plano, TX (US)

( * ) Notice: Subject to any disclaimer, the term of this patent is extended or adjusted under 35 U.S.C. 154(b) by 208 days.

(21) Appl. No.: 15/697,445

(22) Filed: Sep. 6, 2017

(65) Prior Publication Data

US 2018/0087841 A1 Mar. 29, 2018

Related U.S. Application Data

(63) Continuation-in-part of application No. PCT/US2017/048969, filed on Aug. 28, 2017.
(Continued)

(51) Int. Cl.
*F28D 7/00* (2006.01)
*H05K 7/20* (2006.01)
(Continued)

(52) U.S. Cl.
CPC .......... *F28D 7/0066* (2013.01); *B23K 1/0012* (2013.01); *B23P 15/26* (2013.01);
(Continued)

(58) Field of Classification Search
CPC .. F28D 7/0066; F28D 1/0478; F28D 1/05391; F28D 7/103; F28D 7/16;
(Continued)

(56) References Cited

U.S. PATENT DOCUMENTS

| 2,217,410 A | 10/1940 | Howard |
|---|---|---|
| 4,825,941 A | 5/1989 | Hoshino et al. |

(Continued)

FOREIGN PATENT DOCUMENTS

| CN | 103743266 B | 8/2016 |
|---|---|---|
| CN | 103119390 B | 6/2017 |

(Continued)

OTHER PUBLICATIONS

Notification of Transmittal of the International Search Report and The Written Opinion of the International Searching Authority, or the Declaration issued in corresponding PCT application No. PCT/US2017/048969 dated Jan. 10, 2018, 25 pages.
(Continued)

*Primary Examiner* — Tho V Duong
*Assistant Examiner* — Raheena R Malik
(74) *Attorney, Agent, or Firm* — Weber Rosselli & Cannon LLP

(57) ABSTRACT

A cooling system includes a heat exchanger having one or more rows of multiple flat tubes, louvered fins disposed between pairs of flat tubes, and special header tube connections to form a counter flow heat exchanger. Heat exchangers having multiple rows may be placed near or close to the server racks and may be in fluid communication with an outdoor heat exchanger having one or more rows. A single-phase fluid is pumped through a fluid circuit or loop, which includes the heat exchangers at the server racks and the outdoor heat exchanger. The single-phase fluid circuit including the heat exchangers at the IT racks may alternatively be in thermal communication with a water circuit that includes an outdoor fluid cooler. The flat tubes can be formed tubes with one or more channels, or extruded tubes with multiple channels. The heat exchangers include header tubes/connections, which facilitate easy fabrication and con-
(Continued)

nection between rows and inlet/outlet, and lower the pressure drop.

10 Claims, 15 Drawing Sheets

Related U.S. Application Data

(60) Provisional application No. 62/380,039, filed on Aug. 26, 2016, provisional application No. 62/383,878, filed on Sep. 6, 2016.

(51) Int. Cl.
| | |
|---|---|
| *F28D 1/047* | (2006.01) |
| *F28F 1/02* | (2006.01) |
| *G06F 1/20* | (2006.01) |
| *F28F 9/013* | (2006.01) |
| *F28F 1/12* | (2006.01) |
| *F28D 1/053* | (2006.01) |
| *F28F 21/08* | (2006.01) |
| *B23K 1/00* | (2006.01) |
| *B23P 15/26* | (2006.01) |
| *F28F 9/02* | (2006.01) |

(52) U.S. Cl.
CPC ....... *F28D 1/0478* (2013.01); *F28D 1/05391* (2013.01); *F28F 1/022* (2013.01); *F28F 1/12* (2013.01); *F28F 1/128* (2013.01); *F28F 9/013* (2013.01); *F28F 9/02* (2013.01); *F28F 21/084* (2013.01); *G06F 1/20* (2013.01); *H05K 7/2079* (2013.01); *H05K 7/20654* (2013.01); *F28F 2225/08* (2013.01); *F28F 2275/04* (2013.01); *G06F 2200/201* (2013.01)

(58) Field of Classification Search
CPC ... F28D 1/05358; B23K 1/0012; B23P 15/26; F28F 1/022; F28F 1/12; F28F 1/128; F28F 9/013; F28F 9/02; F28F 21/084; F28F 2225/08; F28F 2275/04; G06F 1/20; G06F 2200/201; H05K 7/20654; H05K 7/2079
USPC .................................................. 165/150, 149
See application file for complete search history.

(56) References Cited

U.S. PATENT DOCUMENTS

| | | | |
|---|---|---|---|
| 5,046,554 A * | 9/1991 | Iwasaki ................. | B60K 11/04 123/41.49 |
| 5,086,835 A | 2/1992 | Shinmura | |
| 5,348,081 A | 9/1994 | Halstead et al. | |
| RE35,502 E | 5/1997 | Hughes et al. | |
| 5,727,618 A | 3/1998 | Mundinger et al. | |
| 6,003,592 A | 12/1999 | Yamamoto et al. | |
| 6,034,873 A | 3/2000 | Ståhl et al. | |
| 6,279,354 B1 | 8/2001 | Paek et al. | |
| 6,341,648 B1 | 1/2002 | Fukuoka et al. | |
| 6,408,939 B1 * | 6/2002 | Sugimoto ............. | F28D 1/0435 165/135 |
| 6,460,372 B1 | 10/2002 | Fung et al. | |
| 6,470,961 B1 * | 10/2002 | Case ..................... | B60K 11/04 165/140 |
| 6,609,558 B1 * | 8/2003 | Charbonnelle ....... | F28D 1/0435 165/149 |
| 6,629,561 B2 | 10/2003 | Halt et al. | |
| 6,772,982 B2 * | 8/2004 | Nakagawa ......... | B60H 1/00464 165/67 |
| 6,827,129 B2 * | 12/2004 | Ozawa ................. | B60K 11/04 165/140 |
| 6,918,435 B2 | 7/2005 | Dwyer | |
| 7,131,288 B2 | 11/2006 | Toonen et al. | |
| 7,131,488 B2 * | 11/2006 | Ozaki ................... | F28D 1/0452 165/140 |
| 7,219,511 B2 | 5/2007 | Inaba et al. | |
| 7,228,885 B2 * | 6/2007 | Kolb .................. | B60H 1/00328 123/563 |
| 7,281,387 B2 | 10/2007 | Daddis, Jr. et al. | |
| 7,724,518 B1 | 5/2010 | Carlson et al. | |
| 8,031,468 B2 | 10/2011 | Bean, Jr. et al. | |
| 2003/0141046 A1 | 7/2003 | Ikeda et al. | |
| 2003/0188857 A1 | 10/2003 | Kawakubo et al. | |
| 2004/0020226 A1 | 2/2004 | Bash et al. | |
| 2005/0168945 A1 | 8/2005 | Coglitore | |
| 2005/0205241 A1 | 9/2005 | Goodson et al. | |
| 2006/0016214 A1 | 1/2006 | Gorbounov et al. | |
| 2006/0108098 A1 | 5/2006 | Stevanovic et al. | |
| 2006/0130517 A1 * | 6/2006 | Merkys ................. | F25B 39/022 62/515 |
| 2006/0278379 A1 | 12/2006 | Molavi | |
| 2007/0095087 A1 | 5/2007 | Wilson et al. | |
| 2007/0121294 A1 | 5/2007 | Campbell et al. | |
| 2008/0060372 A1 | 3/2008 | Hillis et al. | |
| 2008/0273306 A1 | 11/2008 | Campbell et al. | |
| 2008/0291626 A1 | 11/2008 | Nelson et al. | |
| 2009/0046427 A1 | 2/2009 | Noteboom et al. | |
| 2009/0122487 A1 | 5/2009 | Campbell et al. | |
| 2009/0154091 A1 | 6/2009 | Yatskov | |
| 2009/0251860 A1 | 10/2009 | Belady et al. | |
| 2010/0091448 A1 | 4/2010 | Noteboom et al. | |
| 2010/0122544 A1 | 5/2010 | Yang et al. | |
| 2010/0144265 A1 | 6/2010 | Bednarcik et al. | |
| 2010/0188816 A1 | 7/2010 | Bean, Jr. et al. | |
| 2010/0190430 A1 | 7/2010 | Rodriguez et al. | |
| 2010/0263830 A1 | 10/2010 | Noteboom et al. | |
| 2011/0056668 A1 | 3/2011 | Taras et al. | |
| 2011/0108207 A1 | 5/2011 | Mainers et al. | |
| 2011/0138823 A1 | 6/2011 | Troutman et al. | |
| 2011/0139410 A1 | 6/2011 | Troutman et al. | |
| 2011/0139423 A1 | 6/2011 | Troutman | |
| 2011/0299242 A1 | 12/2011 | Grantham et al. | |
| 2012/0012283 A1 | 1/2012 | Bean, Jr. et al. | |
| 2012/0097374 A1 | 4/2012 | Altman | |
| 2012/0227943 A1 | 9/2012 | Nakashima | |
| 2013/0240186 A1 * | 9/2013 | Taras ................... | F28D 1/05391 165/146 |
| 2014/0014297 A1 | 1/2014 | Kuang et al. | |
| 2015/0114615 A1 | 4/2015 | Yang | |
| 2015/0114617 A1 | 4/2015 | Yang | |
| 2016/0120067 A1 | 4/2016 | McDonnell et al. | |
| 2016/0298886 A1 | 10/2016 | Ishibashi et al. | |
| 2016/0363381 A1 | 12/2016 | Cho et al. | |

FOREIGN PATENT DOCUMENTS

| | | |
|---|---|---|
| DE | 3936109 A1 | 12/1990 |
| DE | 102004018317 A1 | 11/2005 |
| EP | 1036296 A1 | 9/2000 |
| EP | 1036296 B1 | 1/2004 |
| EP | 2675259 A1 | 12/2013 |
| EP | 2809138 A2 | 12/2014 |
| JP | 2001124490 A | 5/2001 |
| JP | 2001289465 A | 10/2001 |
| JP | 2002181487 A | 6/2002 |
| JP | 2003028539 A | 1/2003 |
| JP | 2003/294338 A | 10/2003 |
| JP | 2005009808 A | 1/2005 |
| JP | 2009123212 A | 6/2009 |
| JP | 5772904 B2 | 9/2015 |
| KR | 100913141 B1 | 8/2009 |
| WO | 2007/102978 A1 | 9/2007 |
| WO | 2013108216 A2 | 7/2013 |
| WO | 2013108217 A2 | 7/2013 |

(56) References Cited

FOREIGN PATENT DOCUMENTS

| WO | 2013/0125533 A1 | 8/2013 |
| WO | 2013125533 A1 | 8/2013 |

OTHER PUBLICATIONS

Invitation to Pay Additional Fees and, where applicable, protest fee issued in corresponding PCT application No. PCT/US2017/048969 dated Nov. 20, 2017, 20 pages.
Communication pursuant to Article 94(3) EPC issued in European Patent Application No. 17765313.6 dated Nov. 10, 2020.
Notification of Reason for Refusal issued in Korean Application No. 10-2019-7008579 dated Nov. 25, 2021 with English translation.

\* cited by examiner

COOLING SYSTEMS AND METHODS USING SINGLE-PHASE FLUID

BACKGROUND

Technical Field

The present disclosure relates to cooling systems and methods using single-phase fluid.

Description of Related Art

Over the past several years, computer equipment manufacturers have expanded the data collection and storage capabilities of their servers. The expansion of server capabilities has led to an increase in total power consumption and total heat output per server and per server rack assembly in data centers. It has also led to an increase in power and temperature control requirements for computer data collection and storage. As a result, the data collection and storage industry has sought and is seeking new, innovative equipment, systems, and design strategies to handle the tremendous and continued growth in capacity of computer data collection and storage.

Cooling systems for computer server racks have been struggling to keep pace with the ability to cool ever increasing computer server heat loads in data centers. The increase of computer server heat loads (measured in kilowatts (kW)) has required that more space be allotted for the cooling infrastructure within the data rooms or that the cooling systems are concentrated at the heat source, i.e., the computer server racks. Recently, cooling systems have been designed to concentrate the cooling at the computer server racks. These cooling systems include rear-door heat exchangers and rack-top coolers.

SUMMARY

In one aspect, the present disclosure features a system for cooling a plurality of information technology (IT) racks. The system includes a heat exchanger disposed at or near a hot aisle formed by the plurality of IT racks. The heat exchanger, in turn, includes a first row including a first plurality of flat tubes and a second row including a second plurality of flat tubes in fluid communication with the first row. The system further includes a fan disposed in air communication with the heat exchanger. The fan moves air from the hot aisle through the heat exchanger from the second row to the first row. The system further includes a single-phase fluid circuit coupled to and in fluid communication with the heat exchanger. The single-phase fluid circuit circulates a single-phase fluid through the heat exchanger from the first flat tube to the second flat tube.

In aspects, each flat tube of the first and second plurality of flat tubes includes one or more channels. Each flat tube of the first and second plurality of flat tubes includes two channels, three channels, or five channels.

In aspects, each flat tube of the first and second plurality of flat tubes is an extruded or brazed aluminum tube.

In aspects, the system includes a plurality of fins disposed between pairs of flat tubes of the first and second plurality of flat tubes. In embodiments, each of the plurality of fins may include a wave pattern in the direction of air flow. In embodiments, the plurality of fins is a louvered fin.

In aspects, the heat exchanger further includes a third row including a third plurality of flat tubes in fluid communication with the second row; and a fourth row including a fourth plurality of flat tubes in fluid communication with the third row. In aspects, the fan moves hot air from the hot aisle through the heat exchanger from the fourth row to the first row, and the single-phase fluid circuit circulates the single-phase fluid through the heat exchanger from the first row to the fourth row.

In aspects, the first row and the second row are connected through an O-ring using one or more fasteners, such as bolts or screws.

In aspects, the single-phase fluid is a fluoroketone (FK) fluid. In aspects, the FK fluid includes micro-encapsulated, phase change material.

In aspects, the system further includes a water circuit; and a second heat exchanger coupled between the single-phase fluid circuit and the water circuit.

In aspects, the system further includes a third heat exchanger disposed in an outdoor fluid cooler and in fluid communication with the water circuit. The third heat exchanger includes one or more rows of a plurality of flat tubes.

In aspects, the system further includes a second heat exchanger disposed in an outdoor fluid cooler and in fluid communication with the single-phase fluid circuit. The second heat exchanger includes one or more rows of a plurality of flat tubes.

In aspects, the heat exchanger is disposed above the hot aisle.

In aspects, the system further includes an air duct coupled between the heat exchanger and the hot aisle.

In another aspect, the present disclosure features a method for cooling a plurality of information technology (IT) racks. The method includes: moving air from a hot aisle formed by a plurality of IT racks across a first plurality of flat, aluminum-formed tubes of a first row of a first heat exchanger and then across a second plurality of flat, aluminum-formed tubes of a second row of the heat exchanger; pumping a single-phase fluid through the heat exchanger from the second plurality of flat, aluminum-formed tubes to the first plurality of flat, aluminum-formed tubes to transfer heat from the air to the single-phase fluid, and through a first channel of a second heat exchanger; and circulating a cooling water solution through a second channel of the second heat exchanger.

In aspects, the single-phase fluid is a fluoroketone (FK) fluid. In aspects, the FK fluid includes micro-encapsulated, phase change material.

In still another aspect, the present disclosure features a heat exchanger. The heat exchanger includes a first row including a first pair of header tubes and a first plurality of flat tubes coupled between the first pair of header tubes so that the first plurality of flat tubes are in fluid communication with the first pair of header tubes. The heat exchanger also includes a second row including a second pair of header tubes and a second plurality of flat tubes coupled between the second pair of header tubes so that the second plurality of flat tubes are in fluid communication with the second pair of header tubes. The header tube of the first pair of header tubes is coupled to a header tube of the second pair of header tubes without using a brazing process. The heat exchanger also includes a plurality of fins disposed between each pair of the first and second plurality of flat tubes.

In aspects, the first row and the second row are separately constructed using a brazing process. In aspects, the first and second plurality of flat tubes each include two channels, three channels, or five channels. In aspects, the first and second plurality of flat tubes are extruded or brazed aluminum tubes.

In aspects, each of the plurality of fins include a wave pattern in the direction of air flow. In aspects, the plurality of fins is a louvered fin.

In aspects, the heat exchanger includes a fluid inlet coupled to and in fluid communication with the first row, a fluid outlet coupled to and in fluid communication with the second row, and one or more fans configured to move hot air through the heat exchanger from the second row to the first row.

In aspects, the header tube of the first pair of header tubes is coupled to the header tube of the second pair of header tubes by coupling a header connection of the header tube of the first pair of header tubes to a header connection of the header tube of the second pair of header tubes via an O-ring or a gasket using a fastener, such as one or more bolts or screws.

In still another aspect, the present disclosure features a method of manufacturing a heat exchanger. The method includes coupling a first plurality of flat tubes between a first pair of header tubes through an automatic brazing process so that the first plurality of flat tubes are in fluid communication with the first pair of header tubes; coupling a second plurality of flat tubes between a second pair of header tubes through an automatic brazing process so that the second plurality of flat tubes are in fluid communication with the second pair of header tubes; and coupling a first header tube of the first pair of header tubes to a second header tube of the second pair of header tubes without using a brazing process.

In aspects, method of manufacturing further includes coupling the first header tube to the second header tube by coupling a first header connection of the first header tube to a second header connection of the second header tube through an O-ring or a gasket.

BRIEF DESCRIPTION OF THE DRAWINGS

Various aspects and features of the present disclosure are described hereinbelow with references to the drawings, wherein.

DETAILED DESCRIPTION

Figure 1:
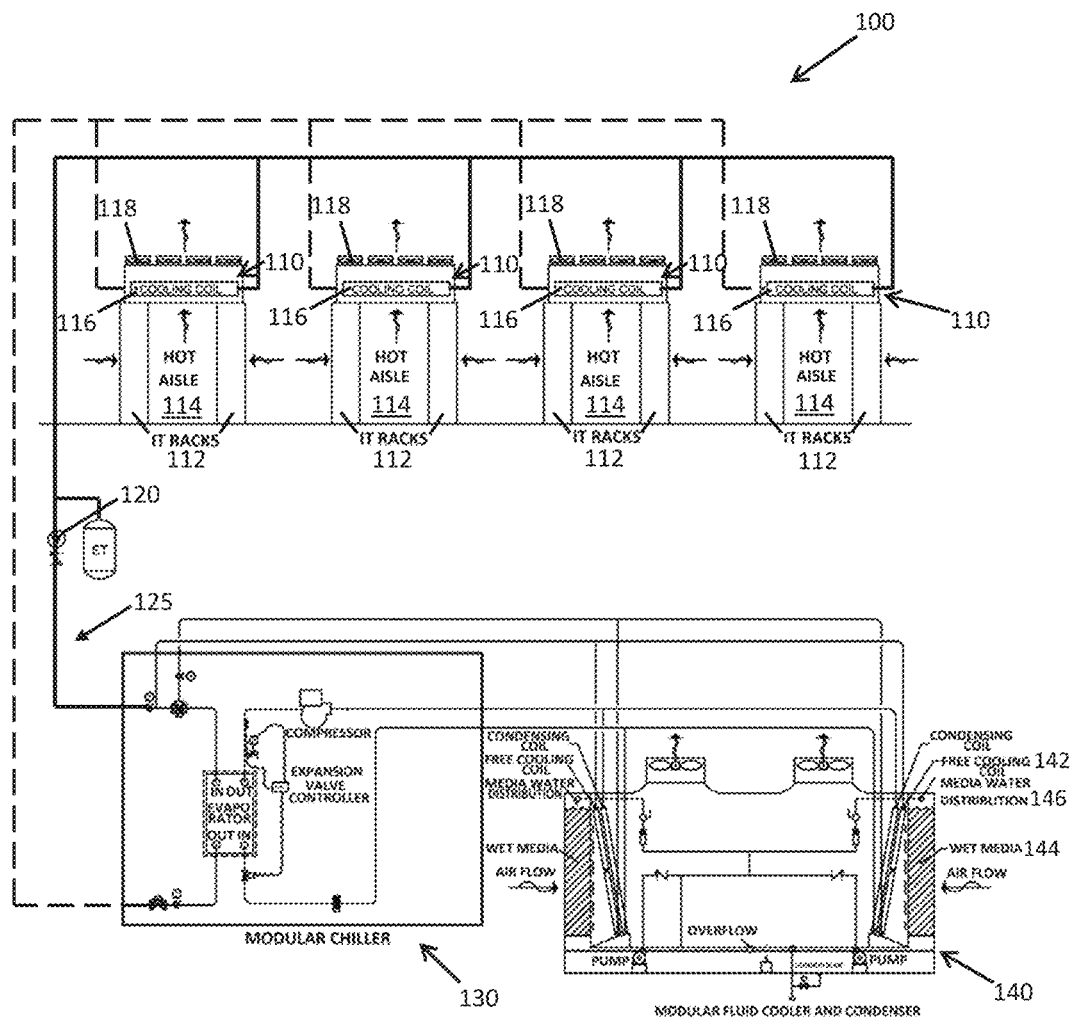
FIG. 1 is a schematic diagram illustrating a single-phase fluid cooling system in accordance with an embodiment of the present disclosure.

Embodiments of the present disclosure are now described in detail with reference to the drawings in which like reference numerals designate identical or corresponding elements in each of the several views. In the drawings and in the description that follows, terms such as front, rear, upper, lower, top, bottom, and similar directional terms are used simply for convenience of description and are not intended to limit the disclosure. Additionally, in the following description, well-known functions or constructions are not described in detail to avoid obscuring the present disclosure in unnecessary detail.

Some computer servers now produce high heat, and rear-door heat exchangers and other similar cooling products on the market have difficulty handling the cooling requirements of these high-density computer servers. Also, traditional fin-copper-tube coils produce significant air side and fluid side pressure drop while single-row flat-tube or microchannel heat exchangers produce high temperature approach for single-phase fluid, resulting in compromised performance.

The present disclosure is related to systems and methods for cooling a data center or other heat load having a high temperature difference. Compared to existing pumped R134a liquid refrigerant systems, the systems according to embodiments of the present disclosure utilize the low specific heat and high temperature difference of a fluoroketone (FK) fluid and counter-flow heat exchangers to achieve higher energy efficiency. The heat exchanger and other portions of the cooling system are less likely to leak due to the FK fluid's low working pressure and single-phase nature. Also, the FK fluid has a global warming potential (GWP) of only one whereas R134a has a GWP of approximately 1400. Compared to water-based liquid cooling systems, the systems according to the present disclosure are safer because FK fluid does not harm server electronics if a leak occurs, there is no possibility of freezing in low temperature outdoor ambient conditions, and there are no concerns about corrosion compared to water-based systems.

The cooling systems according to embodiments of the present disclosure use a single-phase fluid. For example, the cooling systems may use an FK fluid (e.g., Novec™ 649 made by 3M™) or a heat transfer fluid with similar properties. As another example, the cooling systems may use a Hydrofluoroether (HFE) fluid, which is a non-ozone-depleting fluid. The single-phase fluid is pumped to heat exchangers closely coupled to server racks or another heat load to provide cooling. The single-phase fluid warmed by the computer server racks or another heat load is then pumped to an outdoor fluid cooler to reject heat to ambient directly for "free cooling" and further cooled (if necessary) through a chiller evaporator to the needed or desired supply temperature (e.g., 16.7° C.). The cooled single-phase fluid is pumped back to the heat exchangers near the server racks to complete the cycle. The single-phase fluid can also be any other liquid fluid that is non-conductive and inert.

Further, compared to a pumped liquid refrigerant system, the fluid system according to embodiments of the present disclosure does not use a fluid that changes from a liquid phase to a vapor phase and works under relatively low pressure, and thus is much more robust to operate. Also the fluid cycle according to embodiments of the present disclosure maintains high temperature change (e.g., between the temperature of the fluid leaving the heat exchangers at the server load and the temperature of the fluid being supplied by the chiller and/or outdoor fluid cooler) and low temperature approach resulting in a lower fluid flow rate, higher energy efficiency, and more "free cooling" or partial "free cooling" hours than other cooling loop systems.

The present disclosure also features heat exchangers having multiple rows of tubes, and special header tubes to maintain counter flow and facilitate easy connection between rows and inlet/outlet.

FIG. 1 shows a schematic diagram of a cooling system 100 including multiple cooling modules 110. Hot air from IT racks 112 is discharged to the hot aisles 114 and then drawn into FK fluid heat exchangers 116 of the cooling modules 110 at the top of the hot aisles by fans 118 of the cooling modules 110. The heat exchangers 116, which are described in more detail below, include multiple rows of multiple flat tubes. For example, the heat exchangers 116 may include two, three, four, five, or six rows of multiple flat tubes depending on the cooling requirements of the IT racks 112. The hot air is cooled by FK fluid flowing through heat exchangers 116, or another appropriate single-phase fluid, on the tube side of the heat exchangers 116 and the cooled air is discharged back to the room or cold aisle. The warmed FK fluid from the heat exchangers 116 is pumped by a pump 120 to fluid-to-air, free-cooling heat exchanger 142 of an outdoor fluid cooler 140 where the FK fluid is cooled by ambient air.

The heat exchanger 142 includes one or more rows of flat tubes. For example, the heat exchanger 142 may include one or two rows of multiple flat tubes. In another example, the heat exchanger 142 may include two rows of multiple flat tubes in a counter-flow configuration. If further cooling of the FK fluid is needed because, for example, of the high temperature of the ambient air, the modular chiller 130 may be operated. Examples of the modular chiller 130 and the fluid cooler 140 and their operation are described in commonly-owned U.S. application Ser. No. 15/398,512 titled "System and Methods Utilizing Fluid Coolers and Chillers to Perform In-Series Heat Rejection and Trim Cooling," the entire contents of which are incorporated by reference herein.

In one example method, if the temperature of the FK fluid, or another appropriate single-phase fluid, leaving from the fluid cooler 140 reaches a needed supply temperature (e.g., 16.7° C.) when ambient air is cool enough (e.g., 13.3° C.), the FK fluid is pumped back to the indoor hot aisle heat exchangers 116 to complete the cycle for full "free cooling" (no compressor or chiller operation is needed, e.g., the modular chiller 130 does not need to be operated). If the FK fluid leaving from the fluid cooler 140 is greater than the needed supply temperature (e.g., 16.7° C.), the chiller 130 is operated to further cool the FK fluid flowing through the chiller 130 (e.g., flowing through the evaporator of the chiller 130) to the setpoint. Then, the further cooled FK fluid is pumped back to the indoor hot aisle heat exchangers 116 to complete the cycle as "partial free cooling". Adiabatic wet media 144, over which water is distributed by a media water distribution system 146, or a water spray can be placed at the air inlet of the fluid cooler 140 to cool the entering air temperature to close to the wet bulb temperature and thereby increase the full free cooling or partial free cooling to save energy.

Figure 2:
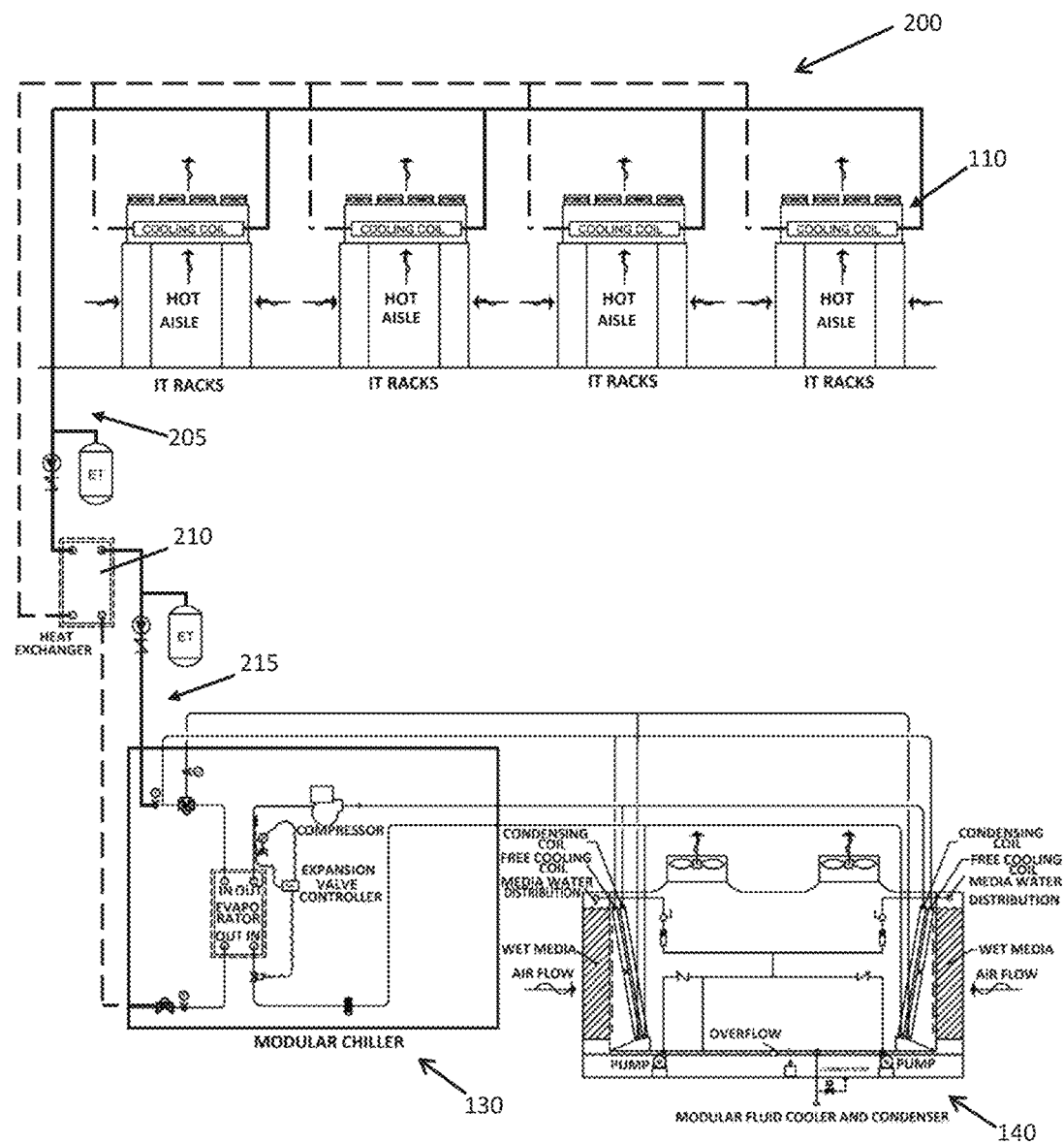
FIG. 2 is a schematic diagram illustrating a single-phase fluid cooling system with an intermediate heat exchanger in accordance with another embodiment of the present disclosure.

FIG. 2 illustrates a cooling system 200, according to another embodiment of the present disclosure. An intermediate plate heat exchanger 210 is used to thermally couple the FK fluid loop or circuit 205 near the server racks to a water loop or circuit 215, which uses cooling water (or a glycol/water mixture or another water solution) to cool the FK fluid and reject heat to the outdoor fluid cooler 140 and/or the chiller 130 (when needed). The advantage of this configuration is that the FK fluid charge volume can be significantly reduced.

Figure 3:
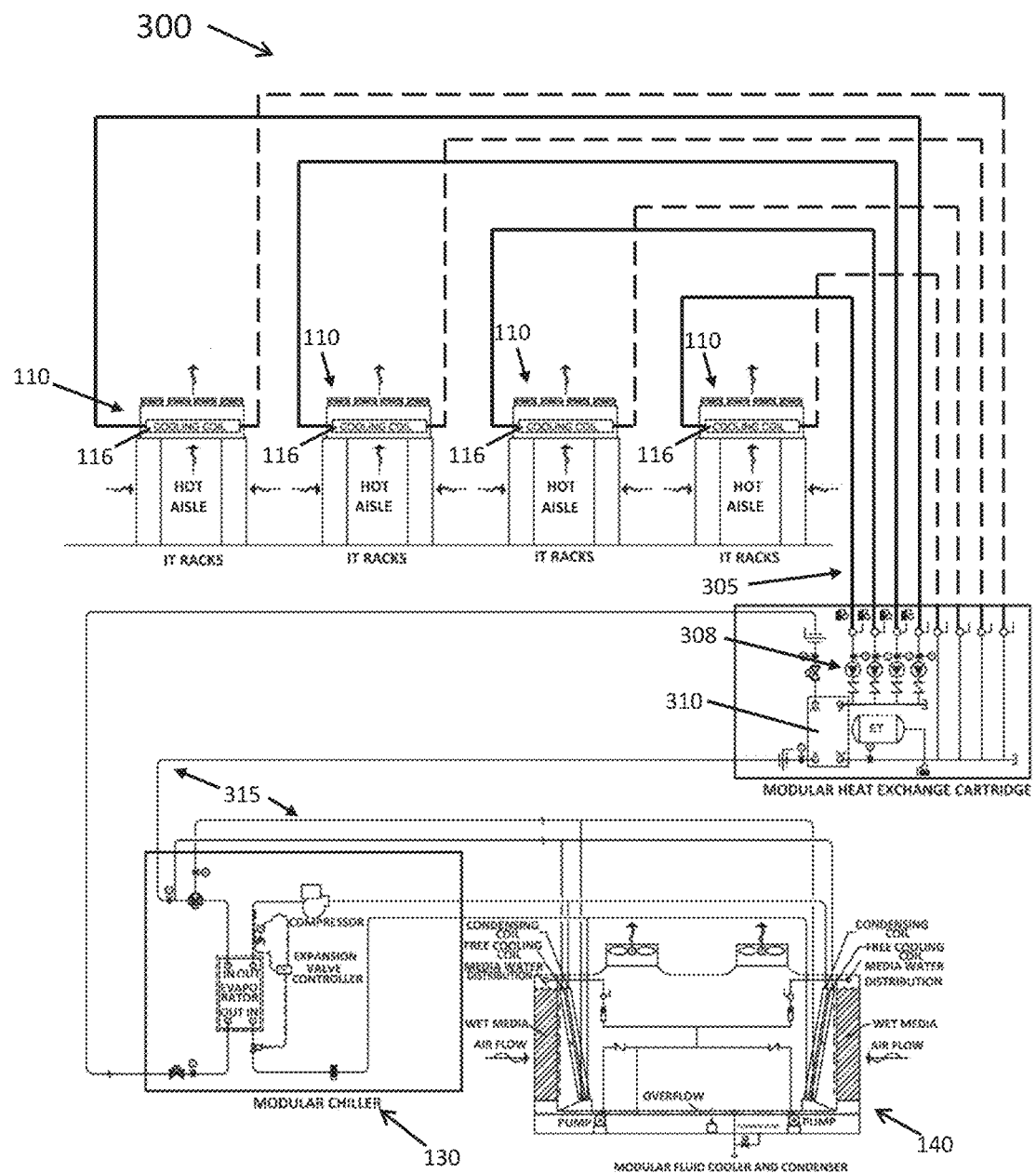
FIG. 3 is a schematic diagram illustrating a single-phase fluid cooling system with an intermediate heat exchanger and individual pump/pipe loops in accordance with yet another embodiment of the present disclosure.

FIG. 3 illustrates a cooling system 300 according to yet another embodiment of the present disclosure. An intermediate plate heat exchanger 310 is used to thermally couple the FK fluid loop 305 near the IT racks to a water loop 315, which uses cooling water (or a glycol/water mixture or another water solution) to cool the FK fluid and reject heat to the outdoor fluid cooler 140 and chiller 130 (when needed). The cooling system 300 uses small secondary pumps 308 and pipes to pump the FK fluid to each individual heat exchanger 116 at the hot aisle separately, thus avoiding large liquid supply and return pipes and avoiding influencing other heat exchangers 116 if one fails.

Figure 4A:
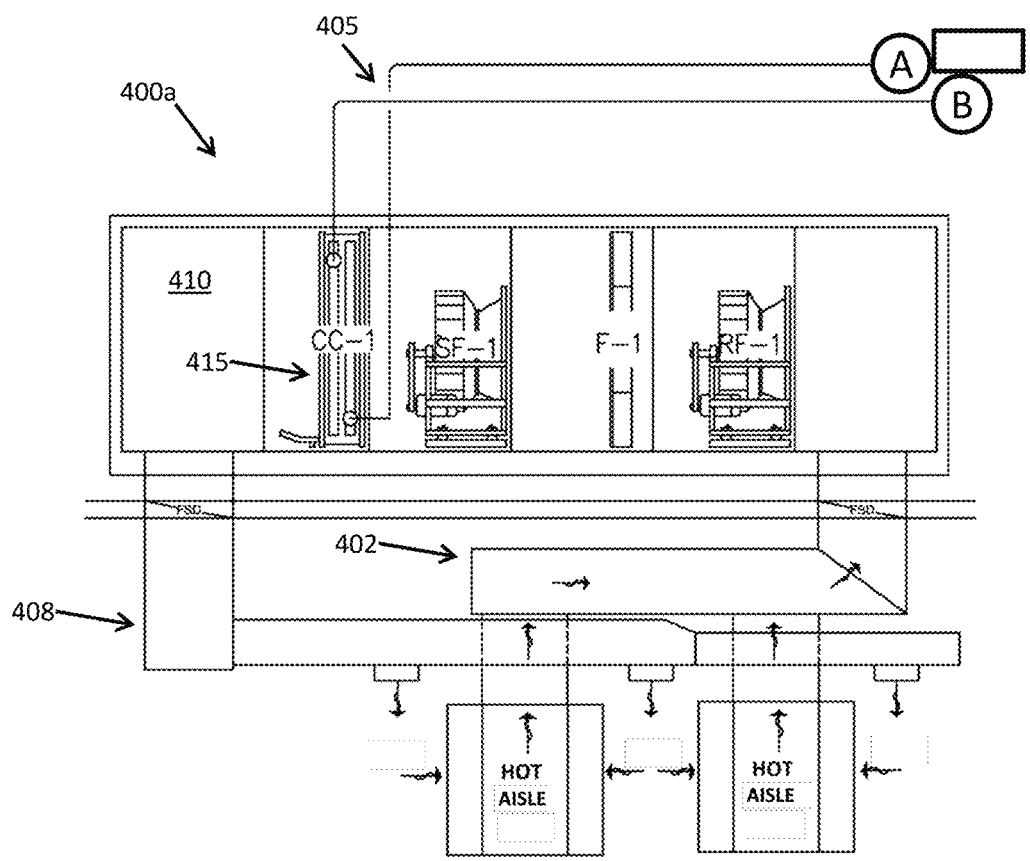
FIGS. 4A and 4B are schematic diagrams illustrating a cooling system with hot air return to rooftop air handler, in accordance with still another embodiment of the present disclosure.
Figure 4B:
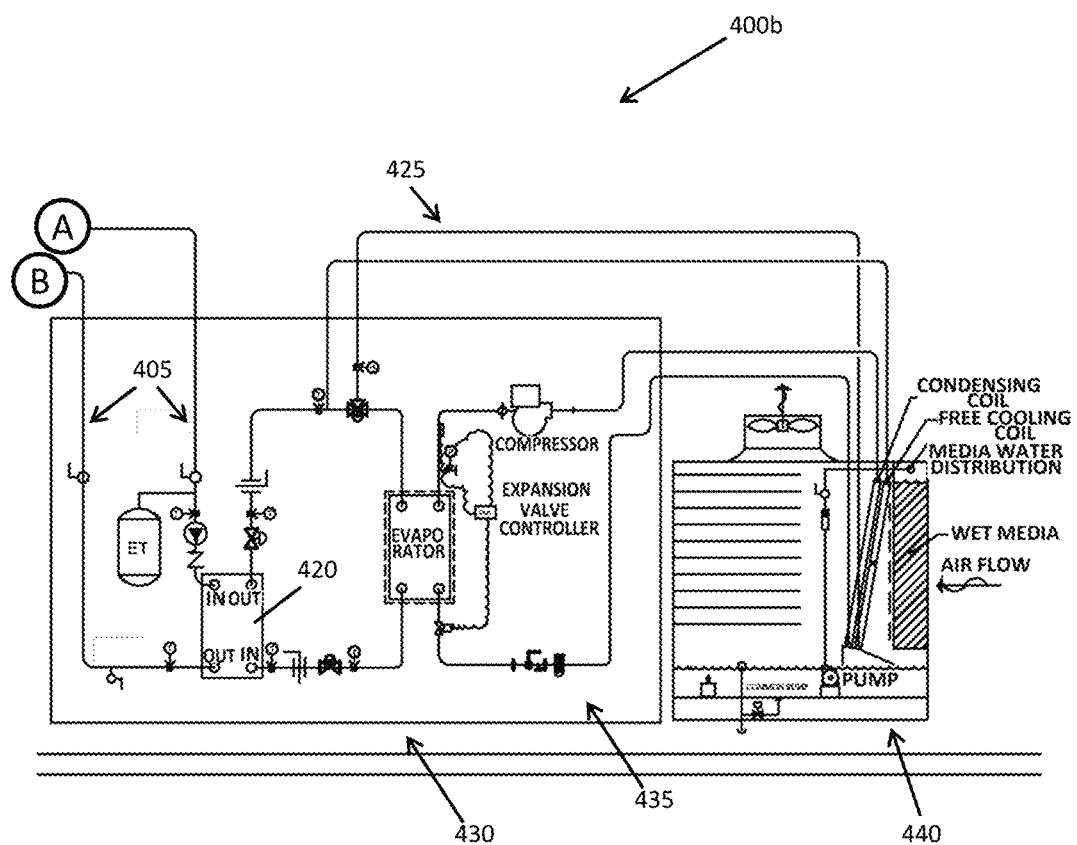

FIGS. 4A and 4B illustrate a cooling system 400 according to still another embodiment of the present disclosure. Hot air from the hot aisle is drawn through a duct 402 to a rooftop air handler unit 410 where it is cooled and sent back to the room or cold aisle via a duct 408. The chilled liquid (e.g., the FK liquid fluid or other similar fluid) is pumped through a single-phase fluid circuit 405, which includes the heat exchanger 415 of the air handler 410 and a heat exchanger 420 (e.g., a flat-plate heat exchanger) that is in fluid communication with the outdoor fluid cooler 440 and the chiller 430 (via a water circuit 425) to provide cooling for the air handler 410 and reject heat to the fluid cooler 440 and the chiller 430. In some embodiments, the chiller circuit 435 of the chiller 430 may utilize a single-phase fluid, such as an FK fluid, or a refrigerant, such as R134a. The heat exchanger 415 and the free cooling coil of the outdoor fluid cooler 440 may be flat-tube heat exchangers including one or more rows of multiple flat tubes according to embodiments disclosed herein, e.g., FIGS. 5A-11D.

According to embodiments of the cooling system, microencapsulated, phase-change material (MEPCM) may be added to the liquid FK fluid to increase heat capacity (i.e., increase the thermal mass/heat transfer) and lower the flow rate/pumping power for all the cooling systems in FIGS. 1-4B. The MEPCM includes multiple different chemical compositions tailored for the working temperature range for data center cooling or any other applications.

In embodiments, the cooling system utilizes a multi-row-flat-aluminum-tube-counter-flow heat exchanger for the indoor hot aisle heat exchanger (or air handler heat exchanger) and outdoor fluid cooler. The high efficiency counter flow heat exchanger can make the leaving fluid temperature from the indoor heat exchanger close to the hot air entering temperature, and the air leaving temperature from the outdoor fluid cooler close to the entering FK fluid temperature. Put another way, these heat exchangers have very high number of transfer units (NTU) or high effectiveness (e.g., 95% or higher). This improves the system energy efficiency over an R134a pumped liquid system or other competing technologies.

Figure 5A:
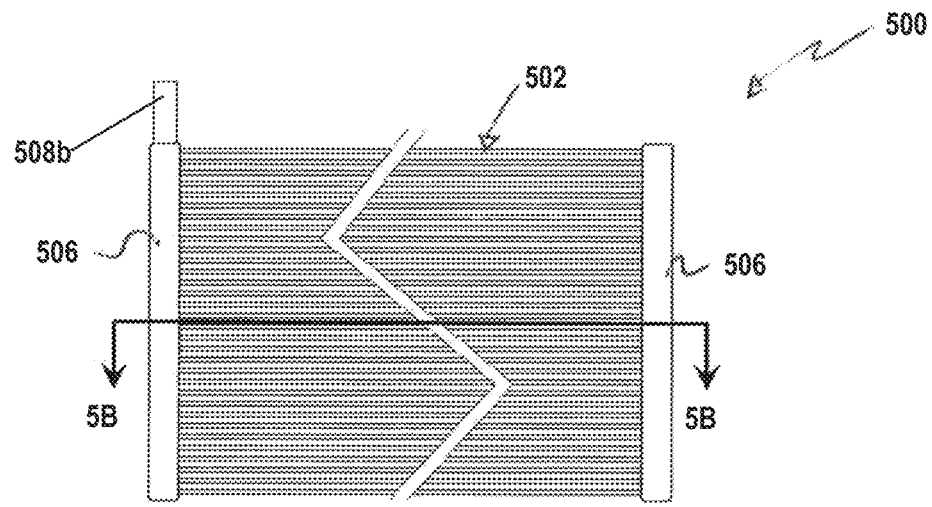
FIG. 5A is a front view of a heat exchanger provided in accordance with the present disclosure.
Figure 5B:
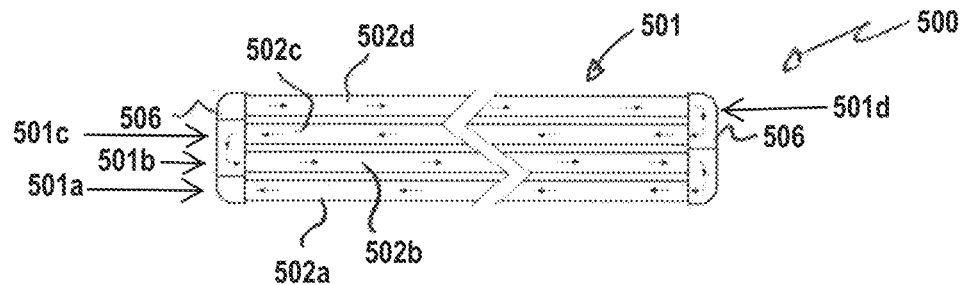
FIG. 5B is a cross-sectional view of the heat exchanger of FIG. 5A taken along section line 5A-5A of FIG. 5A.

FIG. 5A shows a front view of a heat exchanger 500 and FIG. 5B shows a cross-sectional view of the heat exchanger 500 taken along section line 5B-5B of FIG. 5A. The heat exchanger 500 has four rows 501: a first row 501$a$, a second row 501$b$, a third row 501$c$, and a fourth row 501$d$. Alternatively, the heat exchanger 500 may have two rows or any number of rows depending on the specific application. Each of the rows 501 includes multiple tubes 502: the first row 501$a$ includes multiple tubes including tube 502$a$, the second row 501$b$ includes multiple tubes including tube 502$b$, the third row 501$c$ includes multiple tubes including tube 502$c$, and the fourth row 501$d$ includes multiple tubes including tube 502$d$.

The tubes 502 may be flat tubes. The flat tubes may be flat aluminum-formed tubes. Each tube 502 may have a single channel, two channels, or multiple channels (not shown). The tubes 502 may also be multi-port extruded aluminum tubes. The louver fin (not shown) is used on the airside 504 (the fins can be stacked with each piece to cover all four rows 502$a$, 502$b$, 502$c$, 502$d$, or each row 502$a$, 502$b$, 502$c$, 502$d$ has its own fins so the fins are separated for each row 502$a$, 502$b$, 502$c$, 502$d$). The four rows 501$a$, 501$b$, 501$c$, 501$d$ form a counter flow circuit—liquid fluid enters the fourth row 501$d$, then passes through the third row 501$c$, then passes through the second row 501$b$, and then exits from the first row 501$a$, while airflow enters the first row 501$a$ and leaves from the fourth row 501$d$.

Compared to traditional fin-copper-tube coils, the flat tube heat exchanger 500 has better heat transfer performance but lower airflow pressure drop and lower fluid-side pressure drop. Compared to common flat-tube, cross-flow heat exchangers, the multi-rows and counter-flow circuiting of the heat exchanger 500 results in high heat-transfer efficiency with smaller temperature approach between the liquid and air. This is achieved by the entering header tube 506$a$, intermediate header tube 506$b$, and exit header tube 506$c$ of the heat exchanger 500.

FIG. 5B shows a header tube 506 at each end of the heat exchanger 500 to cover all four rows 501$a$, 501$b$, 501$c$, 501$d$ of flat tubes 502$a$, 502$b$, 502$c$, 502$d$ to form counter-flow circuiting with internal partitions.

Figure 5C:
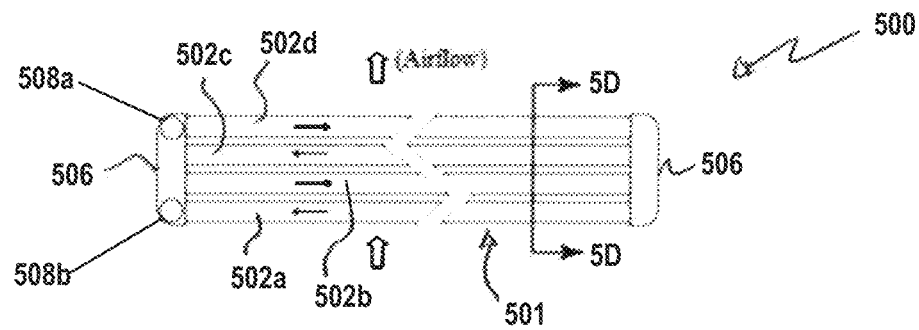
FIG. 5C is a top view of the heat exchanger of FIG. 5A.
Figure 5D:
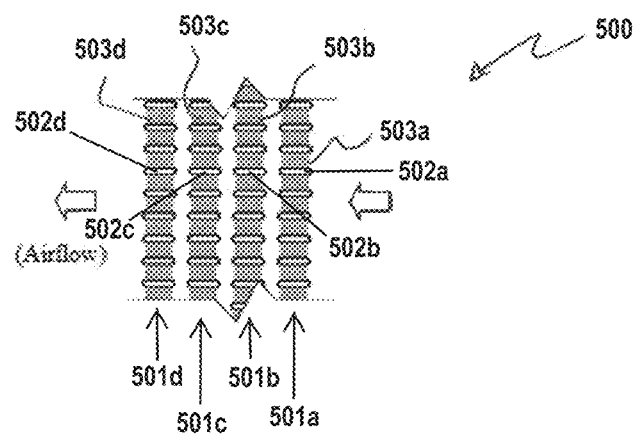
FIG. 5D is a cross-sectional view of the heat exchanger of FIG. 5A taken along section line 5D-5D of FIG. 5C.

FIG. 5C is a top view of the heat exchanger of FIG. 5A and FIG. 5D is a cross-sectional view of the heat exchanger of FIG. 5A taken along section line 5D-5D of FIG. 5C. As shown in FIG. 5C, a fluid inlet tube 508$a$ is connected to the fourth row 501$d$ so that the fluid inlet tube 508$a$ is in fluid communication with the flat tubes 502$d$ of the fourth row 501$d$, and a fluid outlet tube 508$b$ is connected to the first row 501$a$ so that the fluid outlet tube 508$b$ is in fluid communication with the flat tubes 502$a$ of the first row 501$a$. In embodiments of the present disclosure, the fluid inlet tube 508$a$ and the fluid outlet tube 508$b$ may be connected to a single-phase fluid circuit.

FIG. 5D illustrates the multiple flat tubes 502$a$-502$d$ in each of the rows 501$a$-501$d$, respectively. Fins 503$a$-503$d$ are disposed between pairs of the flat tubes 502$a$-502$d$. In some embodiments, the fins 503$a$-503$d$ are louvered fins.

Figure 6:
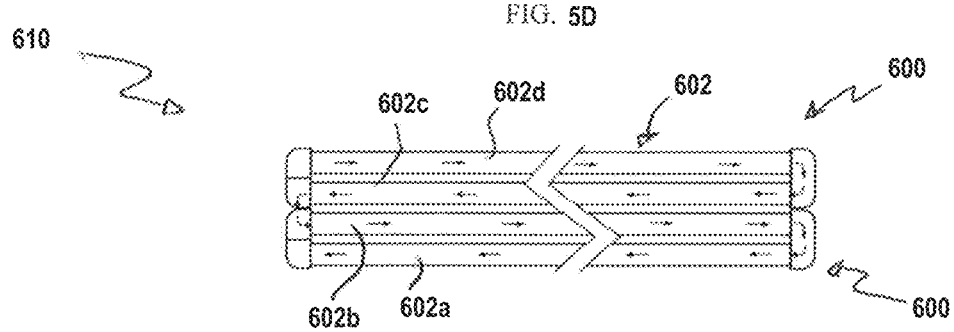
FIG. 6 is a top view of another heat exchanger provided in accordance with the present disclosure.
Figure 7A:
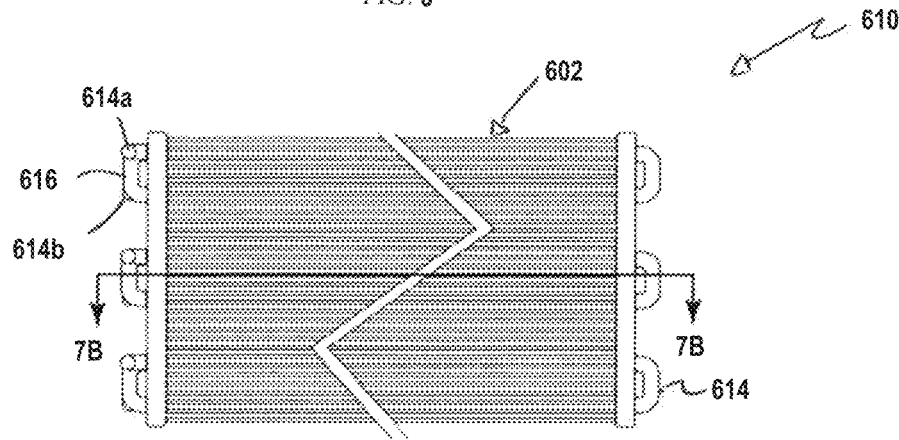
FIG. 7A is a front view of yet another heat exchanger provided in accordance with the present disclosure.
Figure 7B:
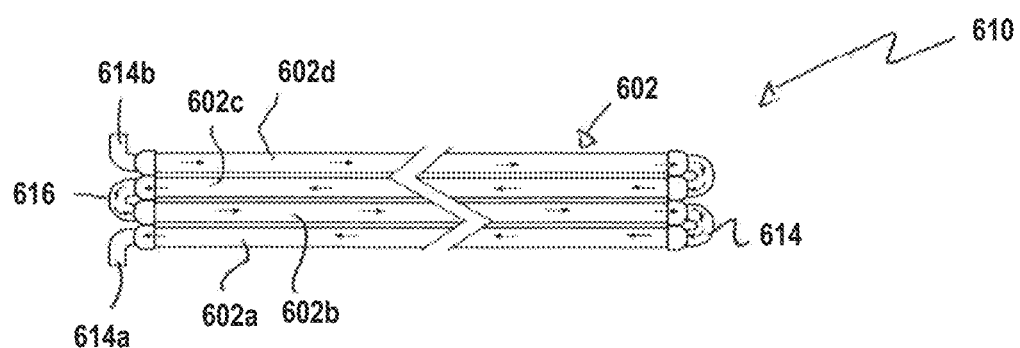
FIG. 7B is a cross-sectional view of the heat exchanger of FIG. 7A taken along section line 7A-7A of FIG. 7A.
Figure 7C:
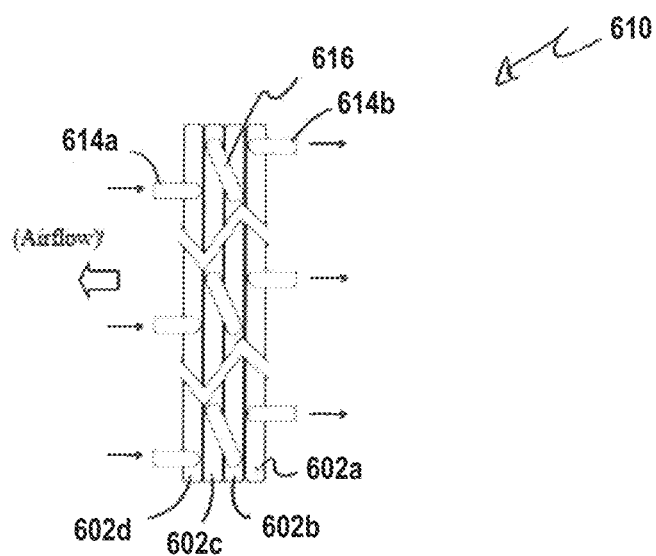
FIG. 7C is a side view of the heat exchanger of FIG. 7A.

FIGS. 6-7C show different embodiments of the rows 501 and header tubes 506. FIG. 6 shows two two-row heat exchangers 600 stacked together to form a four-row heat exchanger 610. The connection between the second row 602$b$ and the third row 602$c$ is through two short connection tubes 612, one connection 612 at each end of the header tube (not shown), or one short connection 612 at either end of the header tube. The liquid fluid enters the fourth row 602$d$ and exits from the first row 602$a$ from one end of the header tube 606 of the respective row 602.

FIGS. 7A-7C show four separate rows 602 stacked together to form a single heat exchanger 610, and liquid connection 614 between every two rows 602 and inlet 614$a$ and outlet 614$b$ is through a set of additional connection tubes 616 from the other side. FIG. 7C is a left side view showing the liquid entrance 614$a$, exit 614$b$, and transition 616 from the second row 602$b$ to the third row 602$c$. The connections 614 between the first row 602$a$ and the second row 602$b$, and between the third row 602$c$ and the fourth row 602$d$ are similar.

In general, the embodiments of the heat exchangers 500, 610 of the present disclosure may be used in any liquid-to-gas heat exchanger. For example, the embodiments of the heat exchangers 500, 610 of the present disclosure may be used for close-coupling heat exchangers near server racks in data center cooling, and also for outdoor fluid coolers for data centers.

Figure 8A:
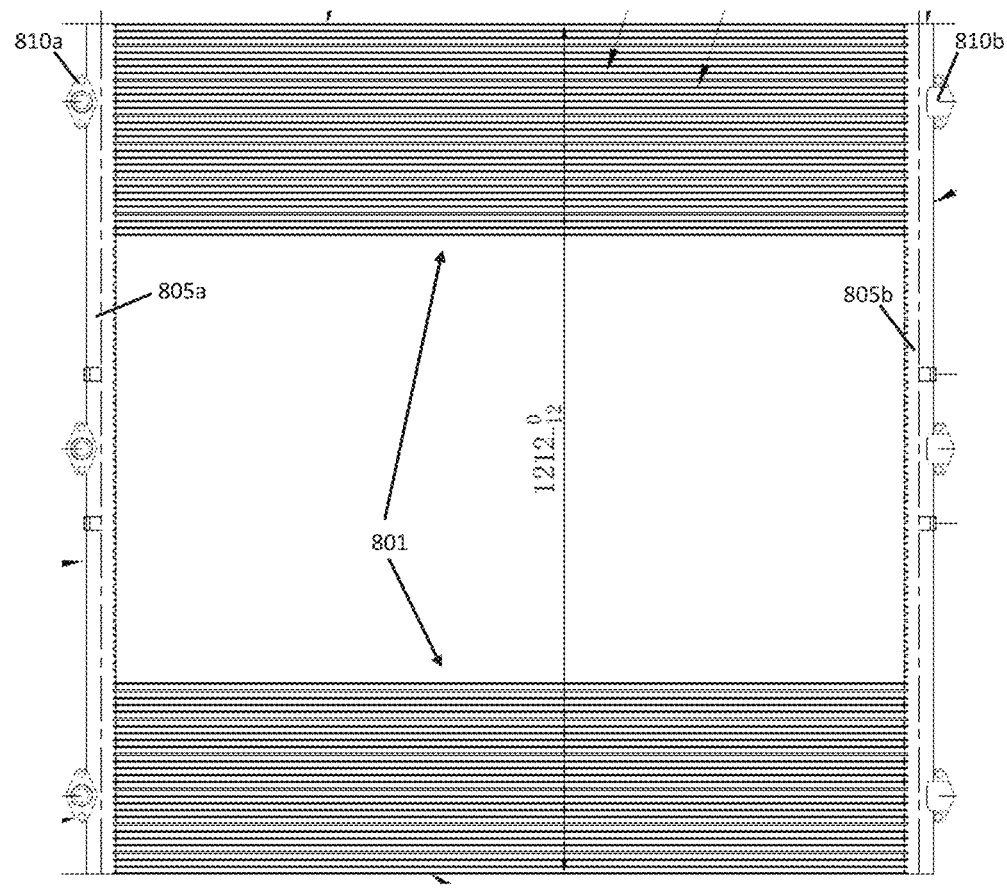
FIG. 8A is a front view of yet another heat exchanger provided in accordance with the present disclosure.
Figure 8B:
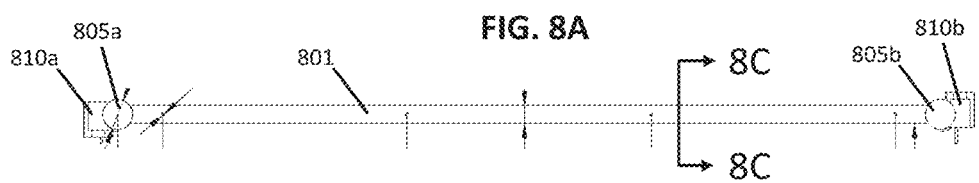
FIG. 8B is a top view of the heat exchanger of FIG. 8A.

FIGS. 8A and 8B illustrate a row of a heat exchanger according to another embodiment. The row includes multiple flat tubes 801 coupled between header tubes 805$a$, 805$b$. The flat tubes 801 may be aluminum tubes, e.g., extruded aluminum tubes. The row also includes header connectors 810$a$, 810$b$ for connecting to one or more other rows. For example, header connectors 810$a$ may connect to header connectors on a first other row and header connectors 810$b$ may connect to header connectors on a second other row. The header connectors 810$a$, 810$b$ may attach or connect to header connectors on other rows via an O-ring or gasket using one or more fasteners, such as bolts or screws. FIG. 8A illustrates a row having three header connectors 810$a$, 810$b$ on each header tube 805$a$, 805$b$, respectively. Other embodiments may include fewer or more header connectors. For example, more header connectors may be used to reduce the pressure differential.

Figure 8C:
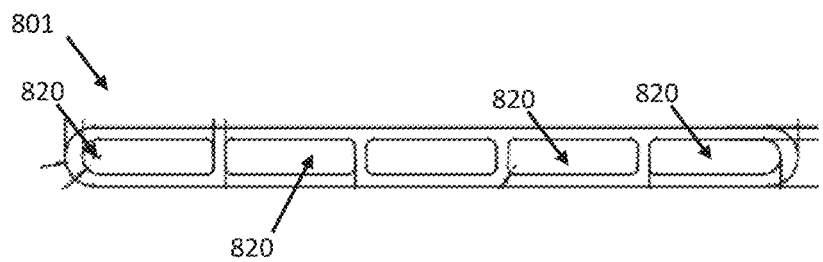
FIG. 8C is a cross-sectional view of a flat tube of the heat exchanger of FIGS. 8A and 8B taken along section line 8C-8C of FIG. 8B.

FIG. 8C is a cross-sectional view of a flat tube 801 of the row of the heat exchanger of FIGS. 8A and 8B taken along section line 8C-8C of FIG. 8B. The flat tube 801 includes five channels 820. Other embodiments of the flat tube 801 may include fewer or more channels 820. For example, the flat tube 801 may include one channel, two channels, three channels, or six channels.

Figure 9A:
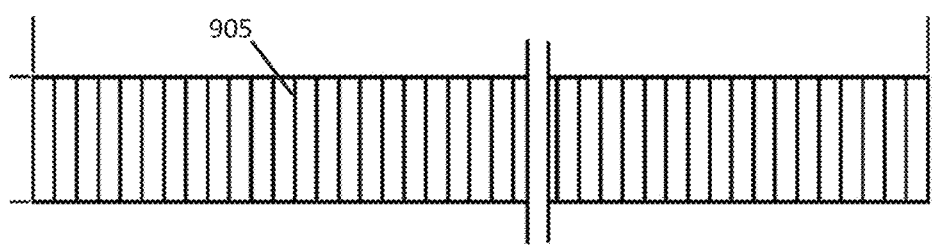
FIG. 9A is a top view of heat exchanger fins provided in accordance with some embodiments of this disclosure.
Figure 9B:
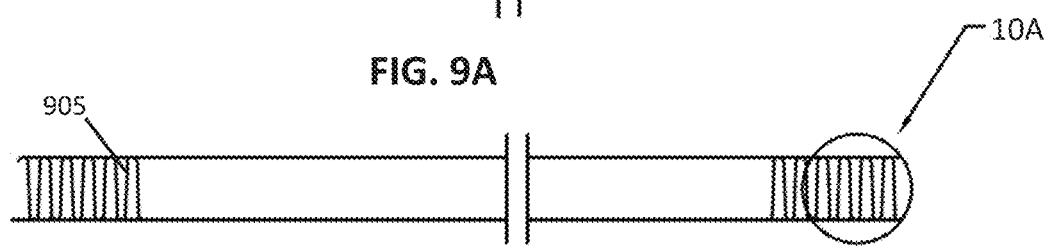
FIG. 9B is a front view of the heat exchanger fins of FIG. 9B.

FIGS. 9A and 9B illustrate heat exchanger fins 905 provided in accordance with some embodiments of this disclosure. The fins 905 are disposed between the flat tubes 801 illustrated in FIGS. 8A-8C to increase heat transfer between the air flowing through the row of the heat exchanger and the fluid, e.g., single-phase fluid, flowing through the heat exchanger.

Figure 10A:
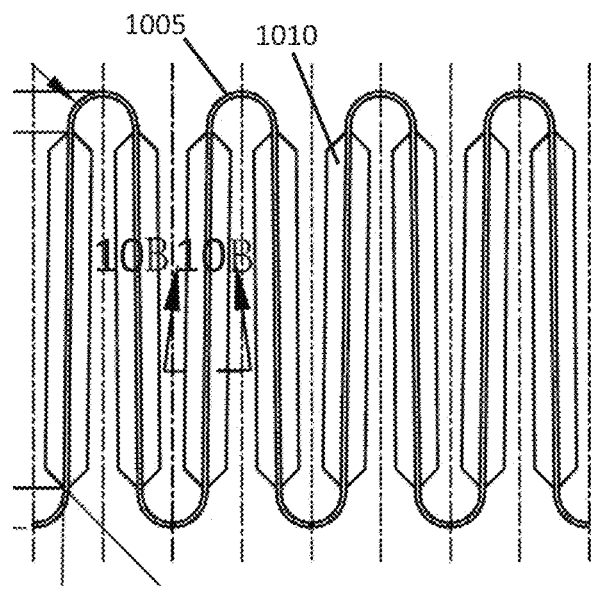
FIG. 10A is a detailed front view of the heat exchanger fins of FIGS. 9A and 9B in accordance with some embodiments of this disclosure.
Figure 10B:
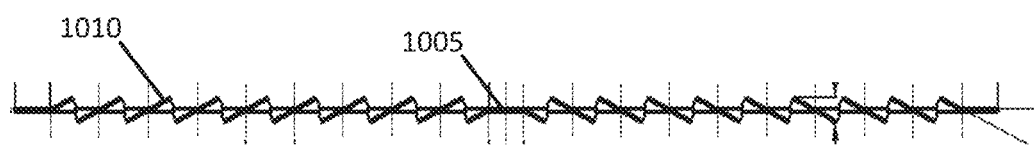
FIG. 10B is a cross-sectional view of a heat exchanger fin of FIG. 10A taken along section line 10B-10B of FIG. 10A.

FIG. 10A is a detailed front view of the heat exchanger fins of FIGS. 9A and 9B in accordance with some embodiments of this disclosure. FIG. 10B is a cross-sectional view of a heat exchanger fin of FIG. 10A taken along section line 10B-10B of FIG. 10A. The fin includes a linear portion 1005 and a wave portion 1010, which, in the illustrated embodiment, has a saw-tooth pattern or shape. In other embodiments, the wave portion 1010 may have a sine pattern or a triangular pattern.

Figure 11A:
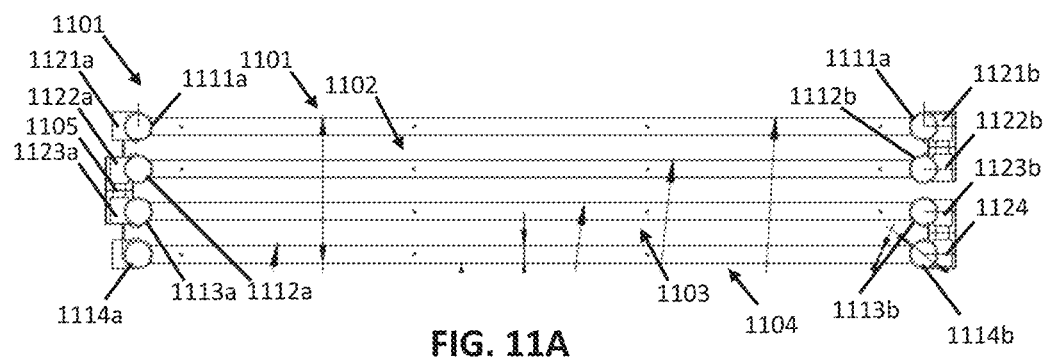
FIG. 11A is a top view of yet another heat exchanger provided in accordance with some embodiments of the present disclosure.
Figure 11B:
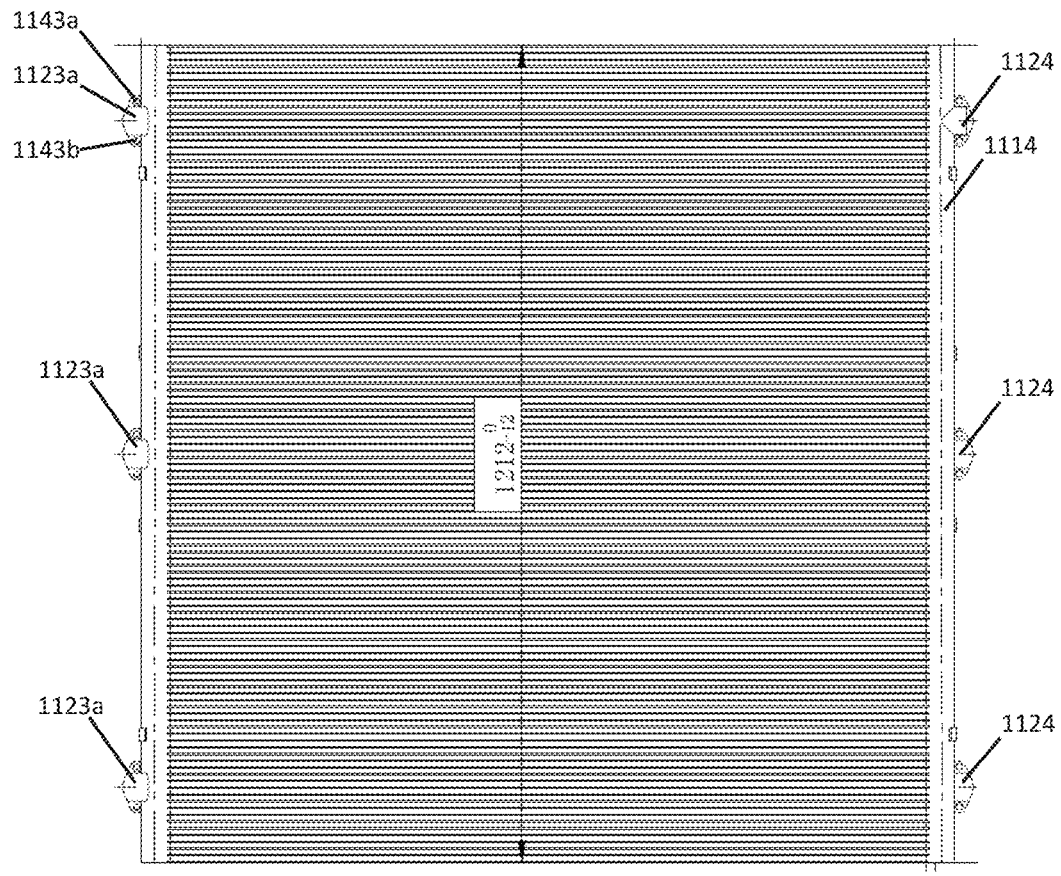
FIG. 11B is a front view of the heat exchanger of FIG. 11A.

FIGS. 11A-11D illustrate yet another heat exchanger provided in accordance with other embodiments of the present disclosure. As shown in FIG. 11A, the heat exchanger 1100 includes four rows 1101-1104. Row 1101 includes header tube 1111 and header connector 1121 attached or connected together, e.g., by a brazing process. Row 1102 includes first header tube 1112a and first header connector 1122a connected together, and second header tube 1112b and second header connector 1122b connected together. Row 1103 includes first header tube 1113a and first header connector 1123a connected together, and second header tube 1113b and second header connector 1123b connected together. Row 1104 includes header tube 1114b and header connector 1124 connected together. Row 1102 and row 1103 are connected together by connecting header connectors 1122a and 1123a. For example, as illustrated in FIG. 11B, header connector 1123a includes holes or openings 1143a, 1144a and header connector 1122a includes corresponding holes through which a bolt or other similar fastener may be placed to connect the header connectors 1122a, 1123a together. An O-ring or gasket 1105 may be placed between the header connectors 1122a, 1123a to provide a seal against leakage of fluid from inside the rows 1101-1104 to the airside. Similarly, header connectors 1121 and 1122b are connected together and header connectors 1123b and 1124 are connected together.

Figures 11C, 11D:
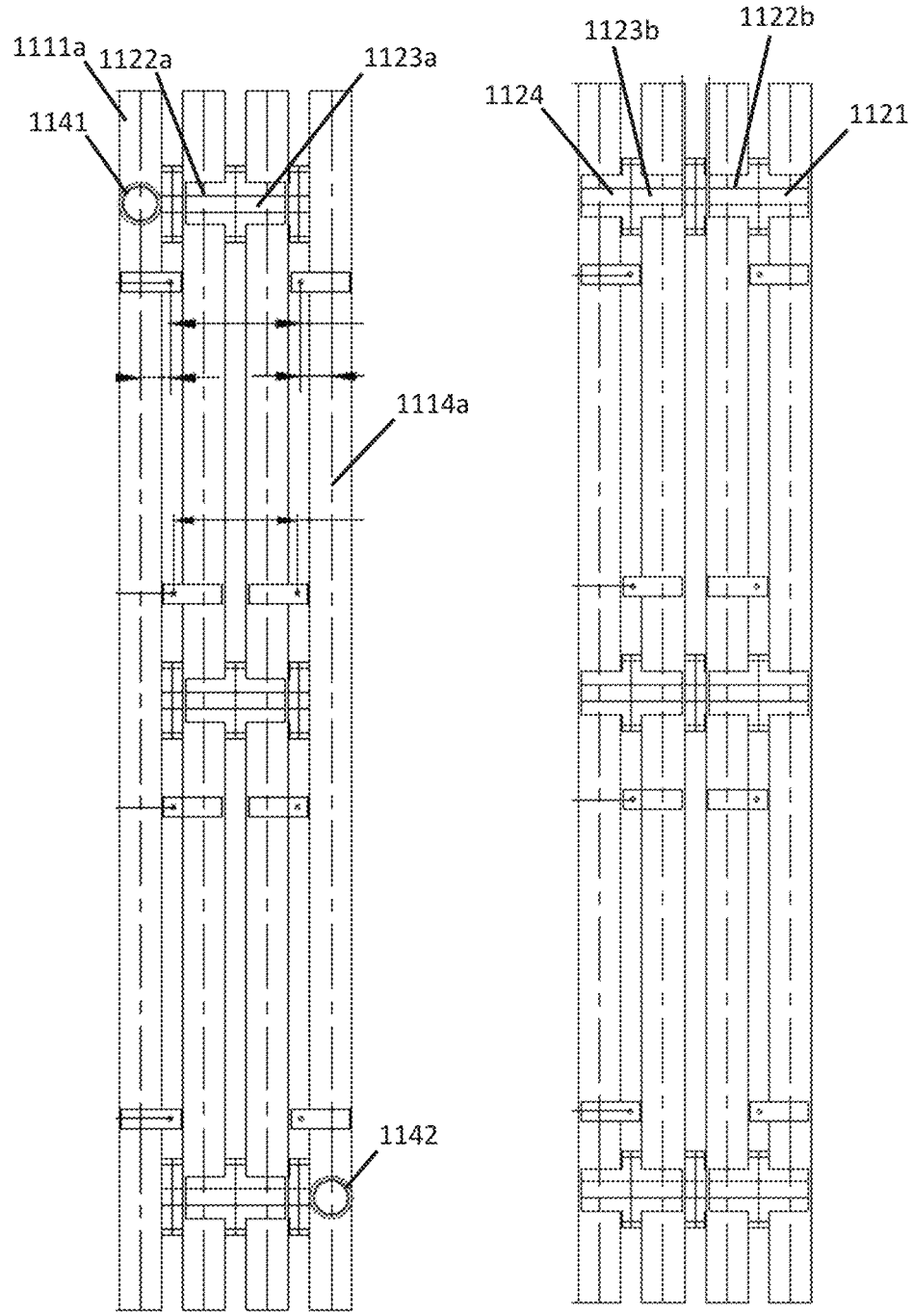
FIG. 11C is a left side view of the heat exchanger of FIGS. 11A and 11B.
FIG. 11D is a right side view of the heat exchanger of FIGS. 11A and 11B.

As shown in FIG. 11C, the first header tube 1111a of the first row 1101 includes an inlet connector or tube stub 1141 for connecting to a fluid supply line and the fourth header tube 1114a of the fourth row 1104 includes an outlet connector or tube stub 1142 for connecting to a fluid return line.

Compared to regular fin copper-tube coils, embodiments of the heat exchanger of FIGS. 8A-11D have a lower pressure drop on both the air side and the liquid side. And its high effectiveness results in a small temperature approach between the air side and the liquid side.

Figure 12:
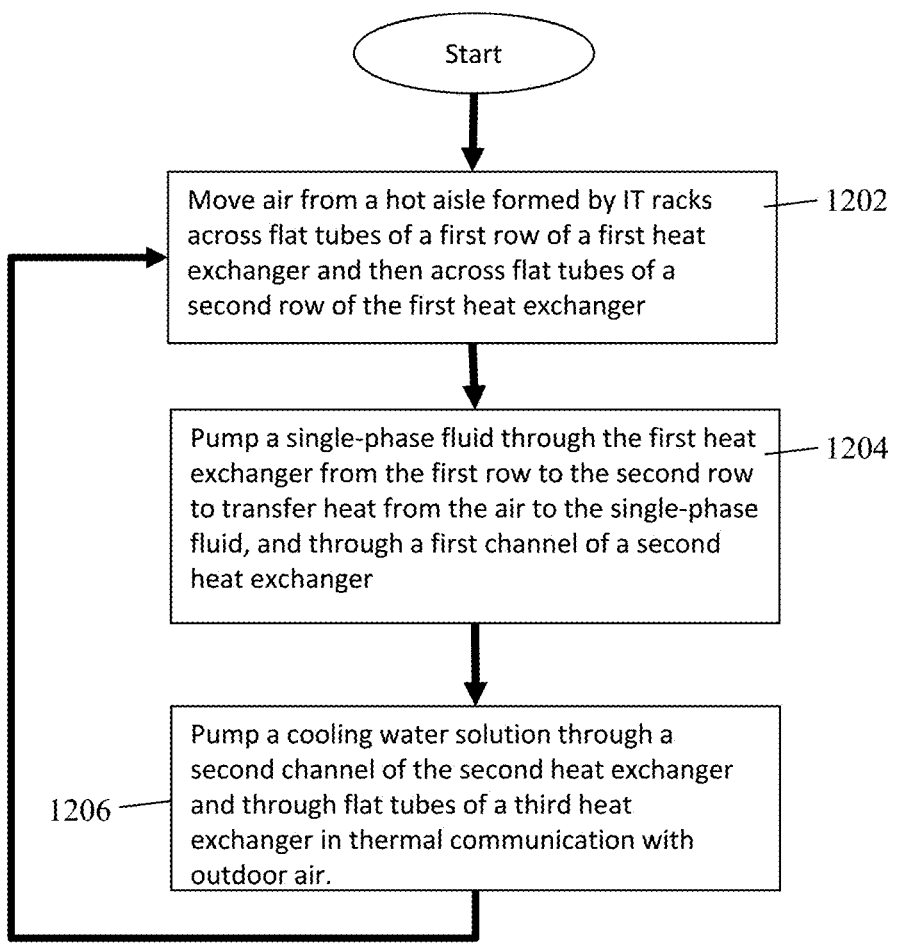
FIG. 12 is a flow diagram illustrating a process according to embodiments of the present disclosure.

FIG. 12 is a flow diagram illustrating a process according to embodiments of the present disclosure. After starting, air is moved from a hot aisle formed by IT racks across flat tubes of a first row of a first heat exchanger and then across flat tubes of a second row of the first heat exchanger, at block 1202. At block 1204, a single-phase fluid is pumped through the first heat exchanger from the first row to the second row to transfer heat from the air to the single-phase fluid, and through a first channel of a second heat exchanger. At block 1206, a cooling water solution is pumped through a second channel of the second heat exchanger and through flat tubes of a third heat exchanger in thermal communication with outdoor air. Then, the process returns to block 1202.

Figure 13:
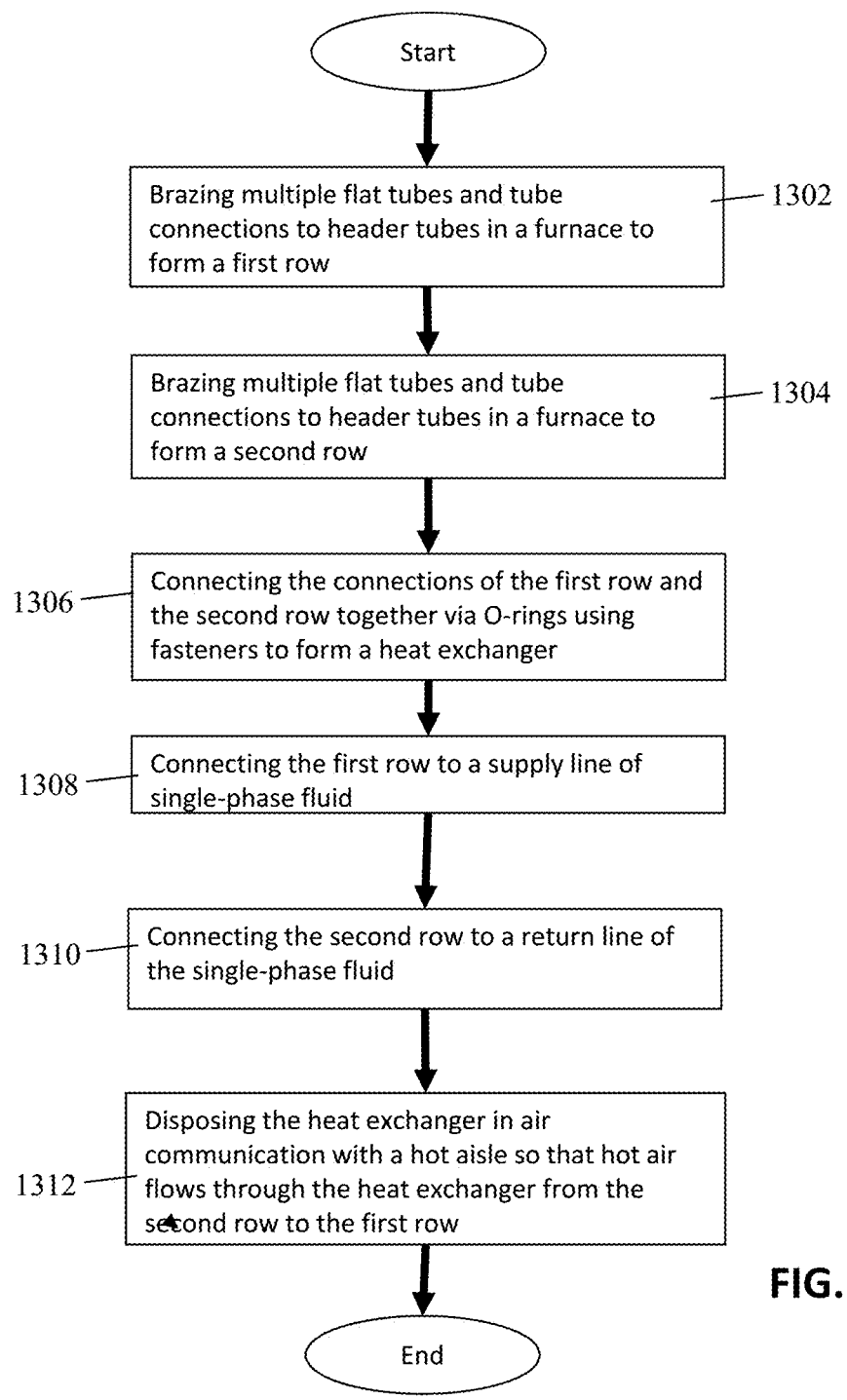
FIG. 13 is a flow diagram illustrating a method of manufacturing according to embodiments of the present disclosure.

FIG. 13 is a flow diagram illustrating a method of manufacturing according to embodiments of the present disclosure. After starting, multiple flat tubes and tube connections are brazed in a furnace to form a first row, in block 1302. In block 1304, multiple flat tubes and tube connections are brazed in a furnace to form a second row. Fins may also be coupled between the multiple flat tubes via a brazing process, such as an aluminum brazing process. In block 1306, the connections of the first row and the second row are connected together via O-rings using fasteners to form a heat exchanger. Additional rows may be formed in a furnace and connected together to form multi-row heat exchangers, such as four-row heat exchangers according to embodiments of the present disclosure.

In block 1308, the first row is connected to a supply line carrying single-phase fluid and, in block 1310, the second row is connected to a return line carrying single-phase fluid. Then, before ending, the heat exchanger is disposed in air communication with a hot aisle so that hot air flows through the heat exchanger from the second row to the first row, in block 1312. That is, the exchanger is oriented in a counter-flow configuration. In embodiments of heat exchangers including four rows, the first row is connected to a supply line carrying single-phase fluid, the fourth row is connected to a return line carrying the single-phase fluid, and the four-row heat exchanger is disposed in air communication with a hot aisle so that hot air flows through the heat exchanger from the fourth row to the first row.

While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. It is contemplated that the embodiments of FIGS. 8C, 9, and 10 are not just applicable to the heat exchangers shown in FIG. 8 or 11, but are also applicable to the embodiments shown in FIGS. 5-7.

The invention claimed is:

1. A heat exchanger, comprising:
a first row including a first pair of header tubes and a first plurality of flat tubes coupled between the first pair of header tubes so that the first plurality of flat tubes is in fluid communication with the first pair of header tubes;
a second row including a second pair of header tubes and a second plurality of flat tubes coupled between the second pair of header tubes so that the second plurality of flat tubes is in fluid communication with the second pair of header tubes, a header tube of the first pair of header tubes integrally coupled to a header tube of the second pair of header tubes to enable fluid flow between the header tube of the first pair of header tubes of the first row and the header tube of the second pair of header tubes of the second row;
a plurality of fins disposed between each pair of the first and second plurality of flat tubes;
a plurality of header connectors integrally coupled to respective orifices in a first header tube of the first pair of header tubes on a first side of the first row;
a plurality of header connectors integrally coupled to respective orifices in a second header tube of the first pair of header tubes on a second side of the first row, wherein the first side of the first row is opposite the second side of the first row;
a plurality of header connectors integrally coupled to respective orifices in a first header tube of the second pair of header tubes on a first side of the second row; and
a plurality of header connectors integrally coupled to respective orifices in a second header tube of the second pair of header tubes on a second side of the second row, wherein the first side of the second row is opposite the second side of the second row,
wherein the plurality of header connectors integrally coupled to respective orifices in the second header tube of the first pair of header tubes on the second side of the first row is coupled to the plurality of header connectors integrally coupled to respective orifices in the first header tube of the second pair of header tubes on the first side of the second row, respectively.

2. The heat exchanger of claim 1, wherein the first and second plurality of flat tubes are extruded or brazed aluminum tubes.

3. The heat exchanger of claim 1, wherein each of the plurality of fins include a wave pattern in a direction of air flow.

4. The heat exchanger of claim 1, wherein the plurality of fins are louvered fins.

5. The heat exchanger of claim 1, further comprising:
a fluid inlet coupled to and in fluid communication with the first row;
a fluid outlet coupled to and in fluid communication with the second row; and
one or more fans configured to move hot air through the heat exchanger from the second row to the first row.

6. The heat exchanger of claim 1, wherein the plurality of header connectors integrally coupled to respective orifices in the second header tube of the first pair of header tubes on the second side of the first row is coupled to the plurality of header connectors integrally coupled to respective orifices in the first header tube of the second pair of header tubes on the first side of the second row, respectively, through an O ring or a gasket and a plurality of fasteners.

7. The heat exchanger of claim 1, further comprising a third row including a third pair of header tubes and a third plurality of flat tubes coupled between the third pair of header tubes so that the third plurality of flat tubes are in fluid communication with the third pair of header tubes, the other header tube of the second pair of header tubes integrally coupled to a header tube of the third pair of header tubes to enable fluid flow between the header tube of the second pair of header tubes and the header tube of the third pair of header tubes.

8. The heat exchanger of claim 1, wherein each plurality of header connectors includes at least three header connectors.

9. The heat exchanger of claim 8, wherein the at least three header connectors are disposed equidistant from each other.

10. A heat exchanger, comprising:
a first row including a first pair of header tubes and a first plurality of flat tubes coupled between the first pair of header tubes so that the first plurality of flat tubes is in fluid communication with the first pair of header tubes;
a second row including a second pair of header tubes and a second plurality of flat tubes coupled between the second pair of header tubes so that the second plurality of flat tubes is in fluid communication with the second pair of header tubes, a header tube of the first pair of header tubes integrally coupled to a header tube of the second pair of header tubes to enable fluid flow between the header tube of the first pair of header tubes of the first row and the header tube of the second pair of header tubes of the second row;
a plurality of fins disposed between each pair of the first and second plurality of flat tubes;
a plurality of header connectors integrally coupled to respective orifices in a first header tube of the first pair of header tubes on a first side of the first row;
a plurality of header connectors integrally coupled to respective orifices in a second header tube of the first pair of header tubes on a second side of the first row, wherein the first side of the first row is opposite the second side of the first row;
a plurality of header connectors integrally coupled to respective orifices in a first header tube of the second pair of header tubes on a first side of the second row; and
a plurality of header connectors integrally coupled to respective orifices in a second header tube of the second pair of header tubes on a second side of the second row, wherein the first side of the second row is opposite the second side of the second row,
wherein the plurality of header connectors integrally coupled to respective orifices in the second header tube of the first pair of header tubes on the second side of the first row is coupled to the plurality of header connectors integrally coupled to respective orifices in the first header tube of the second pair of header tubes on the first side of the second row, respectively, through an O ring or a gasket and a plurality of fasteners.

* * * * *